United States Patent [19]

McMaster

[11] 4,000,469
[45] Dec. 28, 1976

[54] COMBINATION WAVEGUIDE AND STRIPLINE DOWNCONVERTER

[75] Inventor: Thomas Francis McMaster, South Amboy, N.J.

[73] Assignee: Bell Telephone Laboratories, Incorporated, Murray Hill, N.J.

[22] Filed: Dec. 11, 1975

[21] Appl. No.: 639,874

[52] U.S. Cl. .............................. 325/445; 307/88.3; 321/69 W
[51] Int. Cl.² ........................................ H02M 5/04
[58] Field of Search ...................... 321/69 R, 69 W; 307/88.3; 325/430, 438, 445, 446, 449

[56] References Cited

UNITED STATES PATENTS

| | | | |
|---|---|---|---|
| 2,455,657 | 12/1948 | Cork et al. ......................... | 325/445 |
| 2,677,757 | 5/1954 | Matare ............................... | 325/445 |
| 2,813,973 | 11/1957 | McCoy et al. ...................... | 325/439 |
| 3,261,981 | 7/1966 | Harwood et al. .................. | 307/88.3 |
| 3,588,727 | 6/1971 | Seidel ............................... | 325/445 |

OTHER PUBLICATIONS

Bell System Technical Journal July–Aug. 1975, "Stripline Downconverter with Subharmonic Pump": M.V. Schneider and W.W. Snell Jr., pp. 1179–1183.
Microwave Transmission (McGraw Hill) by J.C. Slater, 1942, p. 298.
Handbook of Microwave Techniques and Equipment (Prentice Hall) H.E. Thomas, 1972, p. 152.

Primary Examiner—Benedict V. Safourek
Attorney, Agent, or Firm—Stephen M. Gurey

[57] ABSTRACT

A frequency mixer-downconverter which can be tuned as either a single sideband mixer or a double sideband mixer and which has a wide tunable RF bandwidth and low conversion loss is disclosed. A high-frequency input signal is coupled from an input waveguide to a shielded suspended stripline. Two Schottky barrier diodes are connected proximate to the waveguide-to-stripline transition, between the inner conductor and the outer conducting channel of the stripline. The two diodes intermodulate the input signal with a subharmonic pumping signal which is also coupled to the suspended stripline from a waveguide input. An intermediate frequency signal, at a frequency equal to the difference between the input signal and twice the frequency of the pumping signal, is generated as an intermodulation product and transmitted on the suspended stripline to an output. The downconverter can be tuned as either a single sideband mixer or a double sideband mixer by positioning an E-plane waveguide tuning short and an H-plane waveguide tuning short at the transition between the input waveguide and the suspended stripline. For a single sideband mixer the tuning shorts are adjusted to provide at the input waveguide-to-stripline transition a reactive termination at the image frequency and an impedance match at the input signal frequency. The tuning shorts are positioned to provide the same impedance match at both the image frequency and input signal frequency for double sideband tuning.

10 Claims, 6 Drawing Figures

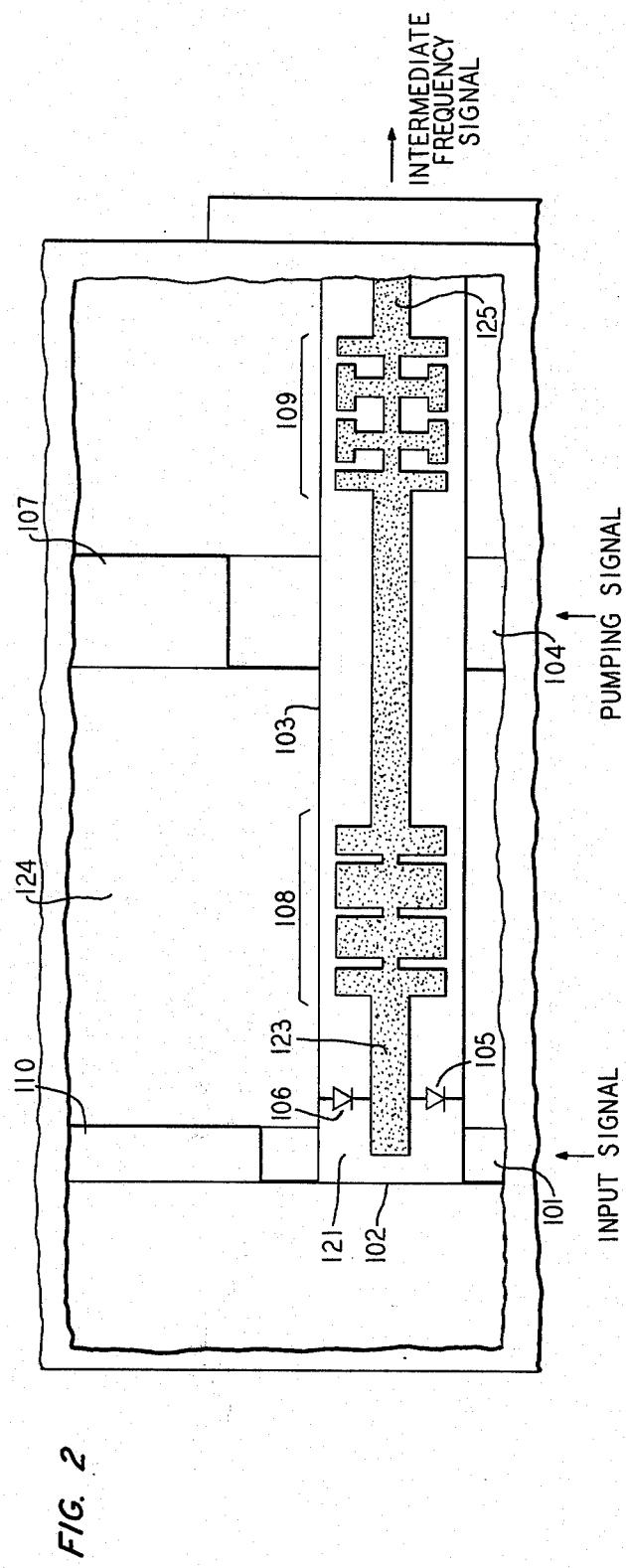
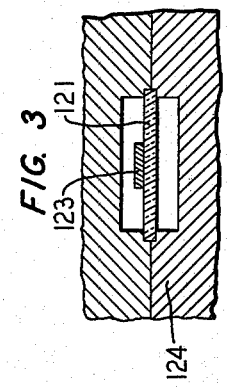
FIG. 2
FIG. 3

COMBINATION WAVEGUIDE AND STRIPLINE DOWNCONVERTER

BACKGROUND OF THE INVENTION

This invention relates to frequency mixers and, more particularly, frequency downconverters in waveguide systems.

As is well known, when a nonlinear device intermodulates a high-frequency input signal with a local oscillator pumping signal, intermodulation products are generated at integral sums and differences of the input signal frequency and the pumping frequency. In a frequency downconverter the intermodulation product having the greatest power is the product at the intermediate frequency, defined as the intermodulation product at the frequency difference between the input signal and the pumping signal. As is known in the art, a frequency downconverter can intermodulate the input signal with a subharmonic of the conventional pumping frequency to generate the same intermediate frequency signal. The mixers of these latter types, such as that described in "Stripline Downconverter with Subharmonic Pump" by M. V. Schneider and W. W. Snell, Jr., *Bell System Technical Journal*, Vol. 53, No. 6, July-August 1974, pp 1179–1183, the selection of the nonlinear device or devices used to intermodulate the input and pumping signals permits the use of a pumping signal having a frequency which is a submultiple of that needed in conventional fundamentally pumped frequency downconverters. Accordingly, in a half-frequency pumped downconverter the intermediate frequency is equal to the difference between the input frequency and twice the pumping frequency.

In either a fundamentally or subharmonically pumped frequency mixer-downconverter the intermodulation product having the second highest power is at the image frequency which is symmetrical with the signal frequency with respect to the pumping frequency (in a fundamentally pumped mixer-downconverter) or twice the pumping frequency (in a half-frequency pumped mixer-downconverter). The image frequency is thus separated from the signal frequency by twice the intermediate frequency. A frequency mixer-downconverter is classified as either single sideband (SSB) or double sideband (DSB) in accordance with the impedance termination of the mixer at the image and signal frequencies. In a single sideband mixer the image frequency sees a reactive termination at the nonlinear device(s) so that all energy generated by the nonlinear device(s) is reflected back into the nonlinear device(s). In a double sideband mixer the image and signal frequencies see the same impedance match at the nonlinear device(s).

Prior art single sideband mixers have used filters at the input to the mixer to reject and filter the image frequencies. These filters, however, narrow the RF bandwidth over which the mixer can operate. In addition, the conversion loss, defined as the difference between the signal power at the input of the mixer and the intermediate frequency output power, was higher than desired. Prior art double sideband mixers have used various standard means to obtain the desired impedance matches at the input to the mixer. Prior art mixer structures have not, however, been able to be tuned for both single sideband and double sideband operation.

SUMMARY OF THE INVENTION

An object of the present invention is to provide a frequency mixer-downconverter having a wide RF tunable bandwidth.

It is an additional object of the present invention to provide a frequency mixer-downconverter which can be tuned as either a single sideband mixer or a double sideband mixer.

In accordance with the present invention a unique and novel input tuning configuration is provided as a transition between an input rectangular waveguide which carries the input high-frequency signal and a transmission line to which is applied the pumping signal. An intermediate frequency signal is generated when the pumping signal and the input signal are intermodulated by a nonlinear device(s) connected between the two conducting elements of the transmission line at a point proximate to the transition between the waveguide and transmission line. The large tunable flexibility of the mixer of the present invention is achieved by including both an E-plane tunable short and an H-plane tunable short at the transition between the input waveguide and the transmission line. Inclusion of both the E-plane and H-plane shorts at the transition enables the frequency mixer-downconverter of the invention to be tuned over a wide RF bandwidth with a relatively low conversion loss. In addition, the frequency mixer-downconverter of the present invention can be tuned as either a single sideband or a double sideband mixer.

In the particular embodiment of the present invention disclosed herein the input waveguide is connected to a shielded suspended stripline transmission line, the outer metal channel of the stripline being connected to the conducting walls of the waveguide. A second waveguide couples the local oscillator pumping signal to the suspended stripline. In this particular embodiment, the mixer is subharmonically pumped at half the fundamental pumping frequency. Two Schottky barrier diodes are connected between the center stripline conductor and the outer metal channel at a point proximate to the point of transition between the input waveguide and the suspended stripline. These diodes intermodulate the pumping signal and the applied input signal to generate on the stripline conductor the intermediate frequency output signal. When operating as a single sideband mixer, the tuning shorts are adjusted such that the impedance the image frequency sees at the transition is purely reactive so that all energy at the image frequency is reflected back into the diodes. When operating as a double sideband mixer, the tuning shorts are adjusted such that the input signal frequency and the image frequency see the same impedance match at the transition.

It is a feature of the present invention that the frequency mixer-downconverter can be accurately tuned with a minimum of effort.

BRIEF DESCRIPTION OF THE DRAWINGS

FIG. 2 is a cut-away top view of the mixer of FIG. 1 showing the suspended stripline and the Schottky barrier diodes;

FIG. 3 is a cut-away cross sectional view showing the stripline transmission line;

DETAILED DESCRIPTION

Figure 1:
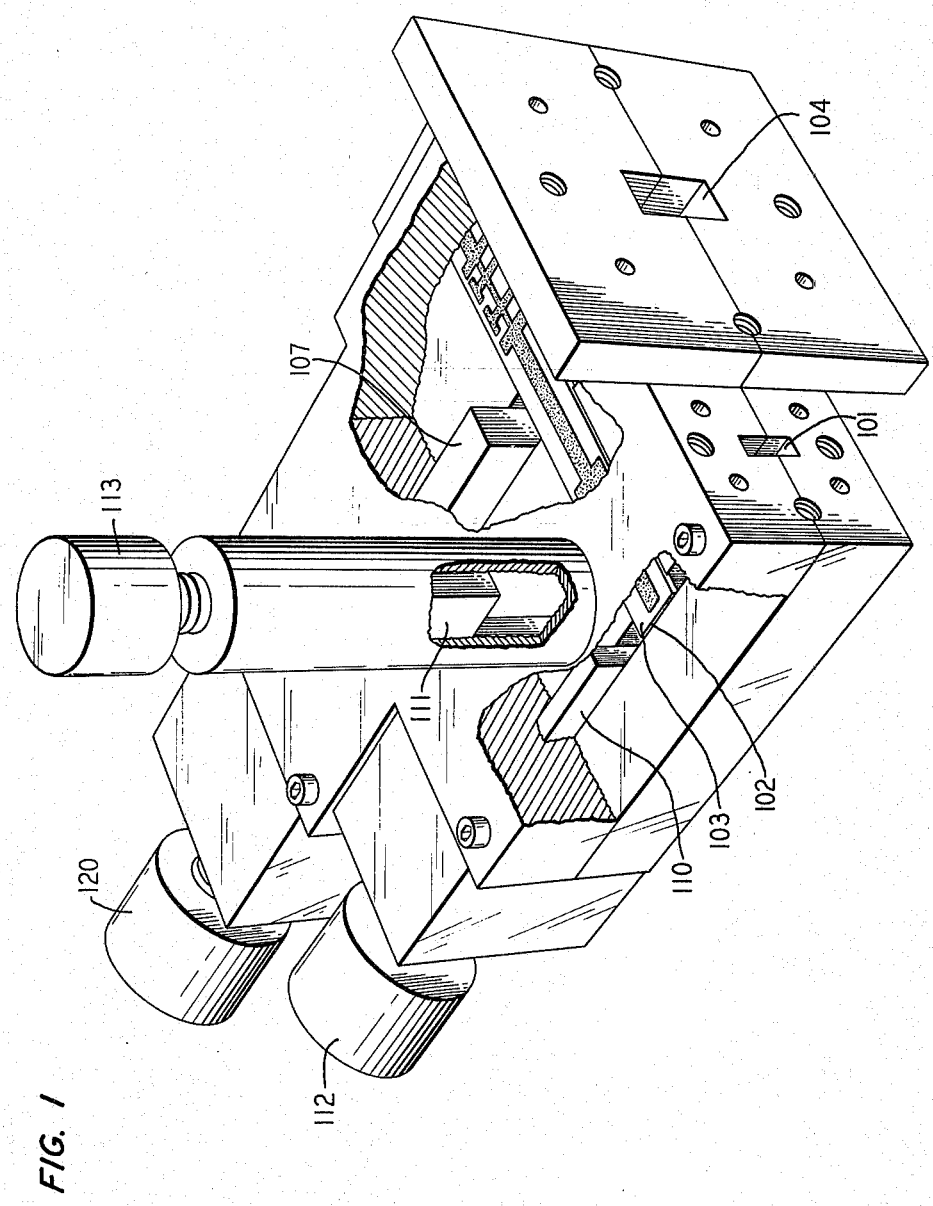
FIG. 1 shows a mixer employing the principles of the present invention.

FIG. 1 illustrates a subharmonically pumped hybrid waveguide-stripline millimeter wave downconverter embodying the present invention. The cut-away areas illustrate the shielded stripline inner conductor and the tunable shorts. FIG. 2 is a cut-away top view of the mixer showing the inner stripline conductor at the transition between the input waveguide and the stripline. FIG. 3 is a cross-sectional view of the shielded suspended stripline. The same numerical designations will be given to corresponding elements in FIGS. 1, 2 and 3. This embodiment of the invention will be described with reference to FIGS. 1 and 2 conjunctively.

The frequency mixer-downconverter of FIGS. 1 and 2 is briefly explained immediately hereinbelow and described in detail thereinafter. With reference to FIG. 1, a high-frequency millimeter wave input signal is transmitted over input waveguide section 101. A shielded suspended stripline 103 is perpendicularly connected to waveguide 101 at a point of transition 102. A pumping signal, at approximately one-half the frequency of the input signal, is coupled from a waveguide section 104 to the suspended stripline 103. A tunable short 107 is adjusted to match waveguide section 104 to the suspended stripline at the pumping frequency. With reference to FIG. 2, two Schottky barrier diodes 105 and 106 are connected between the inner conductor 123 and outer metal channel conductor 124 of the shielded suspended stripline 103 at a point proximate to the point of transition 102. Diodes 105 and 106 intermodulate the pumping signal from waveguide 104 and the input signal from waveguide 101 and generate the intermediate frequency signal between the stripline conductors 123 and 124. Following diodes 105 and 106 on the stripline inner conductor is a thin-film low-pass filter 108 for rejecting the signal frequency and passing the pumping frequency and the intermediate frequency. Similarly, following the transition from waveguide section 104 to the stripline 103 is a second thin-film low-pass filter 109 for passing the intermediate frequency and rejecting the pumping frequency. The signal at the output of the suspended stripline on the conductor at point 125 is the intermediate frequency signal which can be coupled to another transmission medium, such as a coaxial cable line for further transmission.

With reference again to FIG. 1, the frequency mixer-downconverter of the present invention has a wide tunable RF bandwidth and can be operated as either a single sideband mixer or a double sideband mixer by selectively tuning both an E-plane shorting plunger 110 and an H-plane shorting plunger 111 at the transition between waveguide 101 and suspended stripline 103. As will be described in detail hereinafter, tuning shorts 110 and 111 at the transition between the waveguide and the stripline conductor are readily adjusted so that the impedance at the image frequency at transition 102 is purely reactive and an impedance match exists at the input signal frequency (single sideband mixer). Alternatively, tuning shorts 110 and 111 can be readily adjusted so that the signal and image frequencies see the same impedance match (double sideband mixer).

In the embodiment of the present invention described herein the input signal propagating in the $TE_{10}$ mode on input waveguide section 101 is in the frequency range of 47 to 67 GHZ. Waveguide section 101 using the standard EIA WG designation is WR 15 waveguide having the internal dimensions of 0.148 inches by 0.074 inches. As aforenoted, transition section 102 includes a tunable shorting plunger 110 in the E-plane of transmission and an orthogonal tunable shorting plunger 111 in the H-plane of transmission. Tuning shorts 110 and 111 are positionally adjusted in their respective waveguide channels by turning knobs 112 and 113, respectively, attached thereto.

Shielded suspended stripline 103 is orthogonally connected to input waveguide 101 at the point of transition 102. As can be observed in FIG. 2, the inner metallic conductor 123 of stripline 103 extends into the waveguide area of transition 102 for coupling the input signal on waveguide 101 onto the stripline conductor 123. A shielded suspended stripline conductor is employed in the present embodiment of this invention because its inherent structure helps to suppress extraneous modes of transmission and, as a result, has low loss. The present invention, however, could function with other transmission lines, as for example, a coaxial cable line or a microstrip line.

FIG. 3 is a cross sectional view of the shielded suspended stripline. The thin-film stripline conductor 123 having nominal width 0.0433 inches is disposed on a quartz substrate 121 of thickness 0.0083 inches. The thickness of the conductor 123 (which is small) is shown out of proportion with respect to the thickness of the quartz substrate in FIG. 3. The stripline conductor and quartz substrate are suspended in a cavity of the metal channel 124 with interior dimensions of 0.0828 inches by 0.0415 inches. With reference to FIG. 1, the outer metal channel 124 of the shielded stripline forms an equal potential surface with the walls of waveguides 101 and 104. The mode of signal transmission on the shielded suspended stripline conductor is known in the art as a quasi-TEM mode.

In the present embodiment described herein, waveguide 104 is the WR28 waveguide having interior dimensions of 0.280 inches by 0.140 inches. The frequency of the pumping signal transmitted in waveguide 104 in the $TE_{10}$ mode is determined as a function of the desired intermediate frequency signal and the frequency of the input signal of waveguide 101. For a fixed intermediate frequency, the pumping signal is equal to one-half the difference between the input signal frequency and the intermediate frequency. In the present embodiment in which the input signal frequency ranges between 47 GHZ and 67 GHZ, the pumping frequency ranges from 22.8 GHZ to 32.8 GHZ for a fixed intermediate frequency output of 1.4 GHZ. As aforenoted, tunable short 107 is adjusted so as to give a good impedance transformation from the waveguide 104 to the shielded suspended stripline 103 at the pumping frequency. Short 107 is adjusted by turning knob 120. The procedure for obtaining the optimum match between the waveguide 104 and the shielded suspended stripline 103 and the procedures for adjusting the E-plane short 110 and the H-plane short 111 for optimum mixer performance are described in detail hereinafter.

The pumping signal on waveguide 104 is coupled to the shielded suspended stripline 103. Since, as aforenoted, thin-film low-pass filter 109 is chosen to reject the pump frequency, the coupled pumping signal is transmitted along the stripline 103 only through filter 108 towards the diodes 105 and 106. Diodes 105 and 106 intermodulate the input signal coupled from waveguide 101 and the pumping signal to generate on the suspended stripline 103 the intermediate frequency signal and additional intermodulation products, including the product at the aforenoted image frequency. As described in the heretofore noted artible "Stripline Downconverter with Subharmonic Pump", the placement of two Schottky barrier diodes 105 and 106 between the inner stripline conductor 123 and the outer metal channel 124 enables a half-frequency pumping signal to intermodulate with the input signal to generate the same intermediate signal as would be generated using conventional fundamental pumping techniques. Although shown in FIG. 2 as being connected between the inner conductor 123 and the metal channel 124, diodes 105 and 106 could also be connected in the cavity of transition 102 between the inner conductor 123 of stripline 103 and the outer conductor walls of the input waveguide 101 since the waveguide walls and the stripline channel 124 form an equal potential surface.

Figure 4:
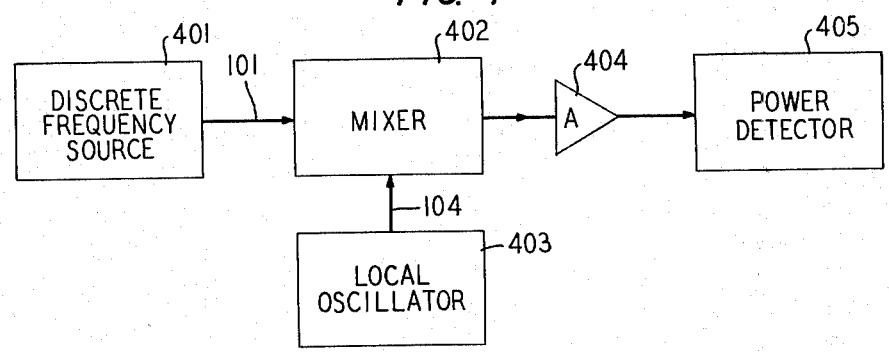
FIG. 4 is a block diagram of the test equipment configuration used to tune the mixer of FIG. 1 as a single sideband mixer.

The frequency mixer-downconverter of the present invention can be tuned for optimum performance over a wide RF bandwidth. In addition, the mixer-downconverter of the invention can be readily tuned as either a single sideband mixer or a double sideband mixer. FIG. 4 illustrates the appartus employed to adjust tuning short 107 for the optimum match between waveguide 104 and stripline 103 and to adjust shorts 110 and 111 for the optimum desired impedances at transition 102 for single sideband tuning. A discrete frequency source 401 generates a signal at the desired input frequency and couples it through waveguide section 101 in FIG. 1 to the mixer-downconverter 402 of the present invention. A local oscillator source 403 generates the pumping signal and couples it over waveguide section 104 to mixer 402. The intermediate frequency output of mixer-downconverter 402 is amplified by an amplifier 404. A power detector 405 measures the power output of amplifier 404. The optimum impedance match between waveguide 104 and shielded suspended stripline 103 is obtained by adjusting the position of short 107 for maximum power output on power detector 405. At this tuned position the maximum pumping signal power is coupled onto the suspended stripline 103 for intermodulation with the input signal.

After waveguide 104 is properly tuned, the frequency mixer-downconverter is readily adjusted as either a single sideband mixer or double sideband mixer. The apparatus of FIG. 4 is employed to tune for single sideband operation. Discrete frequency source 401 is adjusted to generate a discrete frequency signal at the image frequency. H-plane short 111 is then positioned for a null on power detector 405. Discrete frequency source 401 is then adjusted to generate a signal at the desired input signal frequency and E-plane short 110 is positioned for a maximum power deflection on power detector 405.

At an output power null all incoming energy on waveguide 101 is reflected back down the waveguide and no energy is coupled onto the stripline 103. Thus by positioning H-plane tuning short 111 for a power null at the output of the mixer at the image frequency, the impedance at the transition between waveguide 101 and suspended stripline 103 is purely reactive at the image frequency. The intermodulation component generated by diodes 105 and 106 at the image frequency will be reflected back into the diodes for further intermodulation rather than being lost out the waveguide input port. Therefore, power loss is minimized. When the E-plane short 110 is positioned for maximum power output at the signal frequency, the optimum impedance match between waveguide 101 and suspended stripline 103 is achieved.

Figure 5:
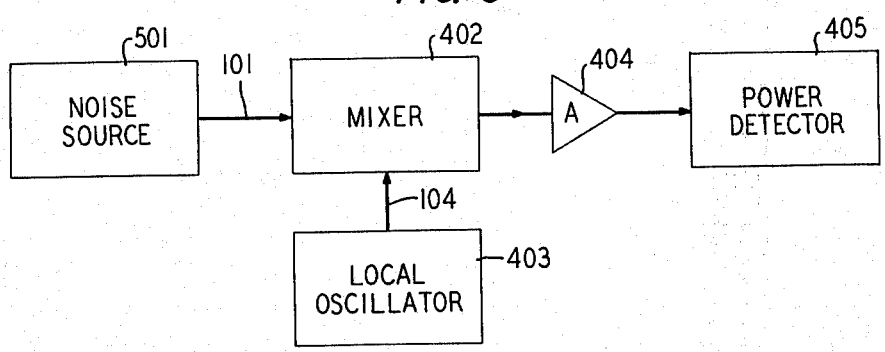
FIG. 5 is a block diagram of the test equipment configuration used to tune the mixer of FIG. 1 as a double sideband mixer.

The mixer of FIG. 1 can also be easily adjusted for operation as a double sideband mixer by using the apparatus illustrated in FIG. 5. In FIG. 5 a wideband noise source 501 is connected to the mixer 402 in place of the discrete frequency source 401 in FIG. 4. Noise source 501 has frequency components at the signal frequency and the image frequency. By independently positioning the E-plane short 110 and the H-plane short 111 for maximum noise power output the optimum impedance match between waveguide 101 and suspended stripline 103 is readily obtained. At these tuning positions the impedance presented at the transition at the signal and image frequencies is the same.

Figure 6:
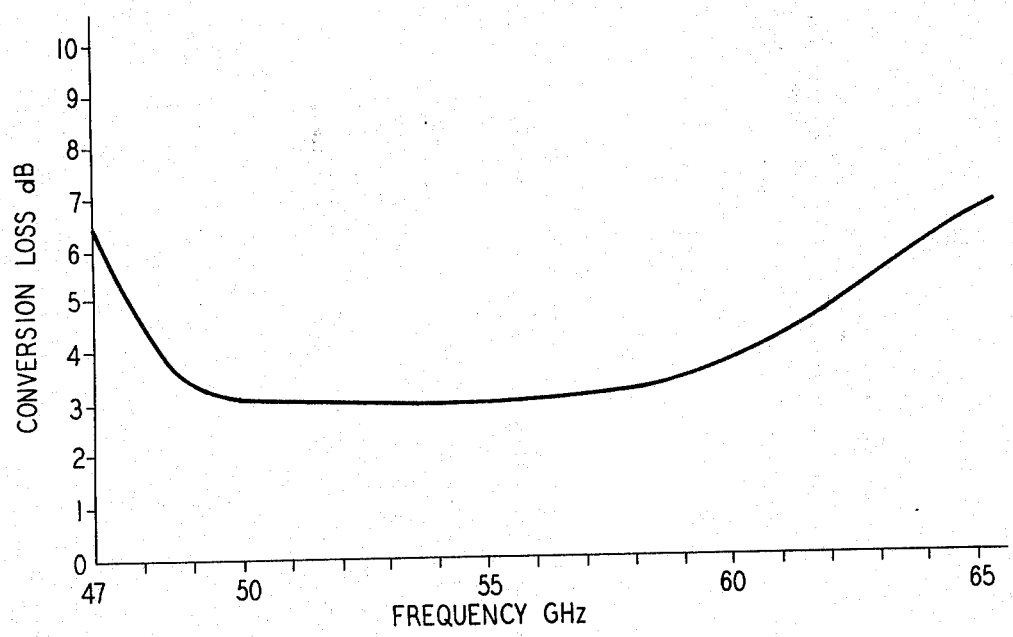
FIG. 6 is a curve of single sideband conversion loss versus input signal frequency for the particular embodiment of the present invention described herein.

FIG. 6 illustrates the single sideband conversion loss versus input signal frequency for the embodiment of the invention described hereinabove. As can be observed, the frequency mixer-downconverter of the present invention has relatively low conversion loss over the frequency bandwidth of 47 to 67 GHZ. Such low conversion loss has not been obtainable in prior art mixers over such a wide signal frequency bandwidth.

Various modifications of this invention can be made without departing from the spirit and scope of the invention. For example, other transmission lines such as a coaxial cable or a microstrip line can be employed in place of the suspended stripline. In addition, the mixer can be pumped with the fundamental pumping signal instead of the subharmonic pumping employed in the present embodiment. The pumping signal, either fundamental or subharmonic, can be coupled to the transmission line by means other than the separate waveguide input employed in the present embodiment. For example, the subharmonic pumping signal can be coupled into the intermediate frequency output of the suspended stripline. The pumping signal in a fundamentally pumped mixer could also be transmitted over the input waveguide to the nonlinear element or elements. In a fundamentally pumped mixer either one, two or four diodes could be used in place of the two Schottky diodes employed in the present embodiment. In addition, although described in connection with a frequency mixer-downconverter, the same principles of the present invention could be readily adapted to a frequency upconverter.

The above-described arrangement is illustrative of the application and principles of the invention. Other embodiments may be devised by those skilled in the art without departing from the spirit and scope of the invention.

What I claim is:

1. A mixer for converting an input signal at a first frequency to an output signal at a second frequency which includes an input rectangular waveguide having orthogonal E- and H-planes for receiving said input signal, transmission means having first and second conductors, means connecting said transmission means to said input rectangular waveguide at a point of transition, means for applying a pumping signal to said transmission means, the frequency of said pumping signal being determined by said first and second frequencies, nonlinear means connected between said first and second conductors of said transmission means at a point proximate to said point of transition for mixing said input signal and said pumping signal to generate on said transmission means said output signal at said second frequency, said mixer being characterized by a first tunable shorting means in the E-plane of said input rectangular waveguide at a point proximate to said point of transition, and a second tunable shorting means in the H-plane of said input rectangular waveguide at a point proximate to said point of transition, said first and second shorting means being adaptable for adjusting impedance terminations at said first frequency and at a frequency determined by said first frequency and the frequency of said pumping frequency.

2. A mixer as defined in claim 1 further characterized in that said first and second tunable shorting means each includes a conducting plunger, said conducting plunger being movably mounted in a rectangular waveguide section.

3. A mixer for downconverting a high-frequency input signal to a signal at an intermediate frequency which includes an input rectangular waveguide having orthogonal E- and H-planes for receiving said input signal, transmission means having first and second conductors, means connecting said transmission means to said input rectangular waveguide at a point of transition, means for applying a pumping signal to said transmission means, the frequency of said pumping signal being determined by the frequency of said input signal and said intermediate frequency, nonlinear means connected between said first and second conductors of said transmission means at a point proximate to said point of transition for intermodulating said input signal and said pumping signal to generate on said transmission means said signal at said intermediate frequency, said nonlinear means also generating an intermodulation product at an image frequency of said input signal, said mixer being characterized by a first tunable shorting means in the E-plane of said input rectangular waveguide at a point proximate to said point of transition, and a second tunable shorting means in the H-plane of said input rectangular waveguide at a point proximate to said point of transition, said first and second tuning short means being positioned to provide predetermined impedance termination at said input frequency and said image frequency.

4. A mixer as defined in claim 3 further characterized in that said first and second tunable shorting means each includes a conducting plunger, said conducting plunger being movably mounted in a rectangular waveguide section.

5. A mixer for downconverting a high-frequency input signal to a signal at an intermediate frequency comprising an input rectangular waveguide having orthogonal E- and H-planes for receiving said input signal, transmission means having first and second conductors, means connecting said transmission means to said input rectangular waveguide at a point of transition, said second conductor of said transmission means being connected to the walls of said input rectangular waveguide at said point of transition to form an equal potential surface, means for applying a pumping signal to said transmission means, the frequency of said pumping signal being determined by the frequency of said input signal and said intermediate frequency, nonlinear means connected between said first conductor of said transmission means and said equal potential surface at a point proximate to said point of transition for intermodulating said input signal and said pumping signal to generate on said transmission means said signal at said intermediate frequency, said nonlinear means also generating an intermodulation component at the image frequency of said input signal, a first tunable shorting means in the E-plane of said input rectangular waveguide at a point proximate to said point of transition, and a second tunable shorting means in the H-plane of said input rectangular waveguide at a point proximate to said point of transition, said first and second tunable shorting means being positioned to provide predetermined impedance terminations at said image frequency and said input signal frequency.

6. A mixer as defined in claim 5 wherein said transmission means comprises a shielded suspended stripline having an inner conductor disposed on a quartz substrate and an outer conducting channel, said outer conducting channel being connected to the walls of said input rectangular waveguide to form said equal potential surface.

7. A mixer as defined in claim 6 wherein said nonlinear means includes at least one diode connected between said inner conductor and said outer conducting channel at a point proximate to said point of transition.

8. A mixer as defined in claim 6 wherein said means for applying said pumping signal includes a second rectangular waveguide perpendicularly connected to said shielded suspended stripline at a second point of transition, and a tunable short at said second point of transition, said tunable short at said second point of transition being positioned to provide an impedance match between said second rectangular waveguide and said shielded suspended stripline at said pumping frequency.

9. A mixer as defined in claim 8 wherein said nonlinear means includes two Schottky barrier diodes connected between said inner conductor and said outer conducting channel at a point proximate to said point of transition between said input rectangular waveguide and said shielded suspended stripline, said second rectangular waveguide coupling a pumping signal at a subharmonic frequency to said shielded suspended stripline, said two Schottky barrier diodes intermodulating said input signal and said subharmonic pumping frequency to generate the intermediate frequency signal with a frequency equal to the difference between said input frequency and twice said subharmonic pumping frequency.

10. A mixer as defined in claim 9 wherein said inner conductor of said stripline includes a first low-pass filtering means connected between said two Schottky Barrier diodes and said second point of transition for rejecting said input signal frequency and for passing said intermediate frequency and said subharmonic pumping frequency and second low-pass filtering means connected after said second point of transition for rejecting said subharmonic pumping frequency and for passing said intermediate frequency.

* * * * *